United States Patent [19]

Hart

[11] Patent Number: 4,967,872

[45] Date of Patent: Nov. 6, 1990

[54] LOUD SPEAKER SYSTEM

[75] Inventor: Frank H. Hart, Menlo Park, Calif.

[73] Assignee: F. H. Hart Engineering Co., Inc., Menlo Park, Calif.

[21] Appl. No.: 367,606

[22] Filed: Jun. 19, 1989

[51] Int. Cl.[5] .................... H05K 5/00

[52] U.S. Cl. .................... 181/155; 181/153; 181/175; 181/199; 381/160; 381/205

[58] Field of Search .................... 181/141, 148, 155, 156, 181/157, 153, 175, 199; 381/24, 86, 160, 205

[56] References Cited

U.S. PATENT DOCUMENTS

| | | | |
|---|---|---|---|
| 1,732,722 | 10/1929 | Horn | 381/169 |
| 2,915,134 | 12/1959 | Braund | 181/156 |
| 2,973,824 | 3/1961 | Pinski | 181/144 |
| 3,026,955 | 3/1962 | Wilber | 181/153 |
| 3,326,321 | 6/1967 | Valuch | 181/144 |
| 3,500,953 | 3/1970 | Lahti | 181/151 |
| 3,819,005 | 6/1974 | Westlund | 181/153 |
| 4,225,010 | 9/1980 | Smith | 181/155 |
| 4,348,750 | 9/1982 | Schwind | 381/160 X |
| 4,421,200 | 12/1983 | Ferralli et al. | 181/144 |
| 4,474,258 | 10/1984 | Westlund | 181/151 |
| 4,588,042 | 5/1986 | Palet et al. | 181/153 |
| 4,800,983 | 1/1989 | Geren | 181/155 |

FOREIGN PATENT DOCUMENTS

| | | | |
|---|---|---|---|
| 0017299 | 1/1982 | Japan | 381/24 |

*Primary Examiner*—Benjamin R. Fuller

*Attorney, Agent, or Firm*—Flehr, Hohbach, Test, Albritton & Herbert

[57] ABSTRACT

A sound diffuser assembly for use with a compressive driver. The sound diffuser assembly has a sound reflector for receiving and redirecting sound energy from the compressive driver. A sound diffuser having a plurality of curved shaped concentric rings is also provided and positioned to receive reflected sound energy and to direct the sound energy in a predetermined pattern. Mounting apparatus is further provided to mount the compressive driver to the assembly so that sound energy from the compressive driver is directed into the sound reflector.

4 Claims, 2 Drawing Sheets

LOUD SPEAKER SYSTEM

This invention relates generally to a loud speaker system and more particularly to a loud speaker system including a compression driver feeding a sound reflector which directs the sound through a sound diffuser.

Loud speaker systems are often used in an industrial environment where there is a high level of ambient sound and a large area needs to be covered. Conventionally, overhead wall mounted speakers are employed. Often such speakers are provided with a sound baffle to block some of the direct sound and provide better coverage. In general, because of the limited area coverage, many speakers are required to cover a large area.

Compression drivers mounted at the end of large horns are used where coverage distance is important. However, the sound is confined to a narrow coverage cone defined by the shape of the horn.

There is a need for a loud speaker system which provides large area coverage with good frequency response so that pages, announcements and background music can be heard throughout the area being covered.

It is a general object of this invention to provide a loud speaker system which provides large area coverage with good frequency response.

It is another object of this invention to provide a loud speaker system which employs a compression driver as the sound source.

It is another object of this invention to provide a loud speaker system which effectively and efficiently uses the sound provided by a compressive driver.

The foregoing and other objects of this invention are achieved by a speaker system which employs a compression driver feeding a reflector with sound energy and in which the reflector redirects the sound from the driver and a diffuser for receiving the reflected sound and directing the sound for broad area coverage.

The foregoing and other objects of this invention will be more clearly understood from the following description when read in conjunction with the accompanying drawings, of which:

Figure 1:
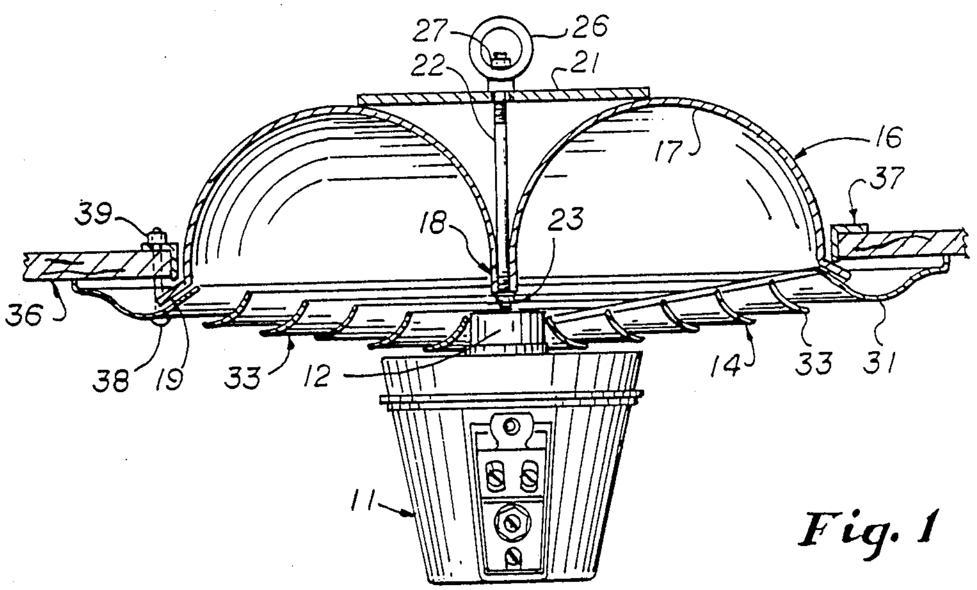
FIG. 1 is a sectional view of a loud speaker system in accordance with the present invention.
Figure 2:
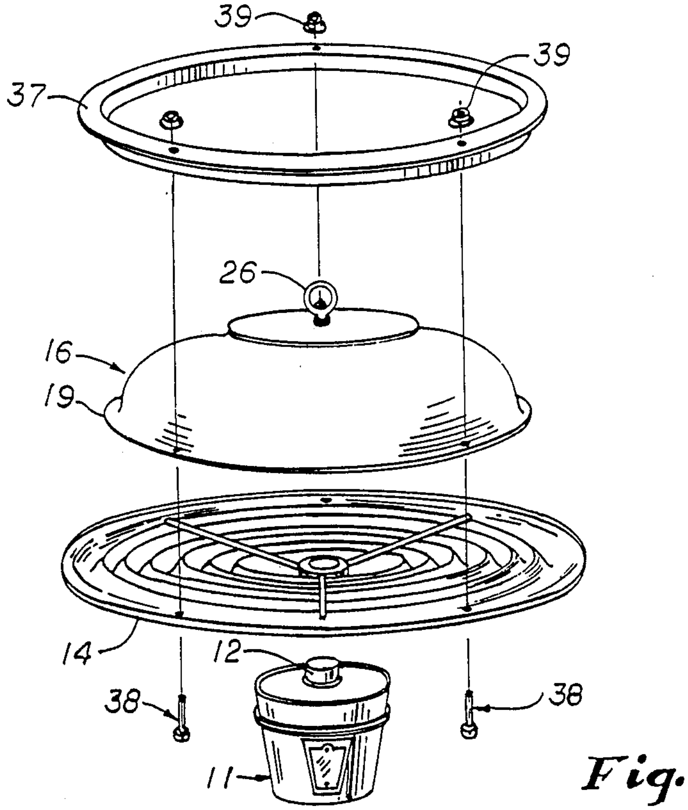
FIG. 2 is a perspective exploded view of the speaker system of FIG. 1, showing the various components of the system.
Figure 3:
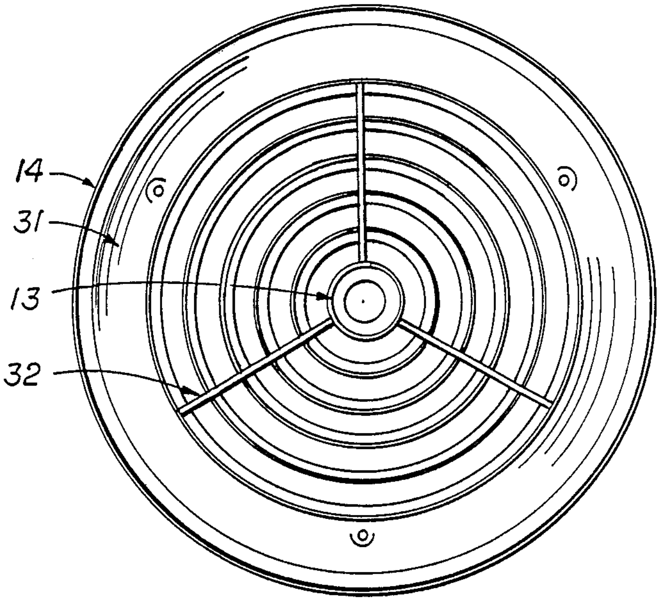
FIG. 3 is a bottom view of the speaker system.
Figure 4:
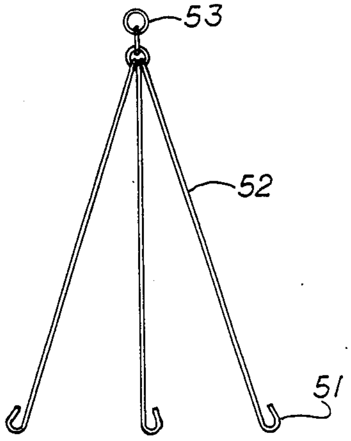
FIG. 4 is a view showing an alternate hanger for the speaker system of FIG. 1.

Generally, the speaker system of this invention includes a compressive driver 11 which is driven by a suitable audio amplifier and which provides compressive sound waves emitting outwardly from the end 12. Compressive drivers of this type are well known For example, the driver may be purchased from Atlas Sound of Parsippany, N.J., Model PE 30T, or other equivalent compressive drivers having desired power output, and may be used in this invention.

The end 12 is threaded and received by a nut 13 carried at the center of the sound diffuser 14. Opposite the end 12, there is provided a suitable reflector 16 which may be formed by spinning a concave surface of a revolution 17 which defines a conical centerpost 18 opposite the driver end 12 and an outer circular rim 19. A cap or closure 21 may be held on the back of the reflector by means of a bolt 22 which extends through the conical portion 18 and receives a securing nut 23 and which is tightened to hold closure 21 against the reflector; or alternatively, it may be welded to the back of the reflector. The end of the bolt 23 extends upwardly and receives a supporting loop 26, which is held by a second nut 27 threadably received by the upper end of the bolt 23.

Sound diffuser 14 cooperates with the open end of the reflector to diffuse the sound. The diffuser 14 may, for example, be constructed by an outer curved ring 31 which receives the end of rods 32 with the other end of the rods secured to the nut 13, which threadably receives the end 12 of the driver 11. A plurality of additional, curved diffuser rings 33 are formed and secured to the rods in spaced concentric relationship to one another to provide a plurality of concentric diffuser rings 33.

The speaker system can be supported from a ceiling 36 by means of a ring 37 and bolts 38 which extend through the outer diffuser ring 31 through the ceiling and through the ring 37 and receive nuts 39 to secure the assembly to the ceiling.

Figure 5:
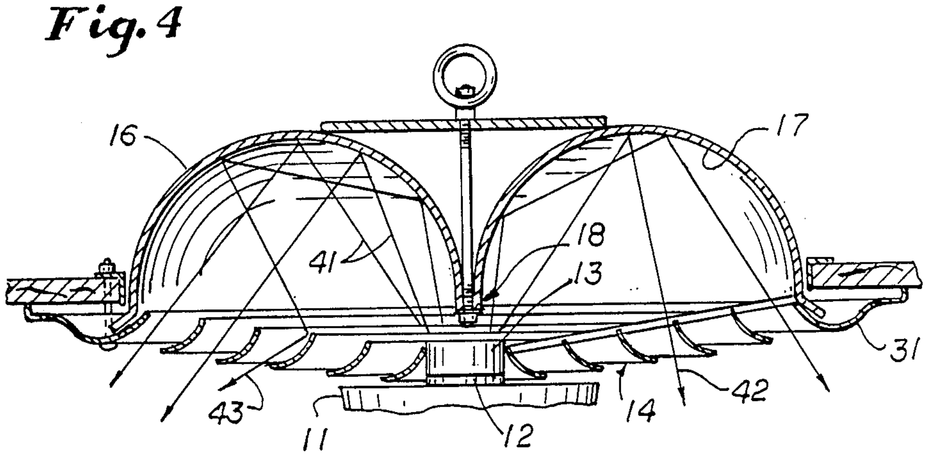
FIG. 5 is a schematic view showing how the speaker system reflects and diffuses the sound from the compression driver.

In operation, referring more particularly to FIG. 5, sound waves are projected upwardly by the driver as shown by the arrows 41. Some of the sound energy strikes the end of the conical center 18 and is reflected, and the remaining energy travels upwardly and is reflected downwardly as shown by the arrows 42. Some of the reflected sound energy travels through the space between the diffuser rings 33 and covers the area immediately below the speaker. The remainder of the sound energy strikes the deflector rings and is deflected outwardly as schematically shown by the arrows 43. By properly shaping and placing the various rings, the sound waves can be made to deflect outwardly and cover a hemispherical area.

In certain installations, the speaker systems cannot be ceiling mounted. In such installations the ring 37 is engaged by the hooked ends 51 of suspension wires 52. The other ends of the wires are supported by the ring 53. The length of the wires can be varied for hanging the speaker assembly at any desired angle. The speaker system can also be suspended from the loop 26.

It is apparent that the reflector and the diffuser can be shaped to cover a rectangular or other shaped area. Compression drivers 11 at various wattage may be screwed into the nut 13 of the reflector assembly without modification of the remainder of the assembly.

Thus, there has been provided a speaker system which effectively and efficiently employs all the sound energy from a compressive driver and which directs the sound waves to cover a predetermined, in the instances illustrated, hemispherical area with good fidelity and efficiency.

What is claimed is:

1. A sound diffuser assembly for use with a compressive driver including a sound reflector for receiving and redirecting sound energy from said compressive driver, a sound diffuser having a plurality of curved spaced concentric rings located in close proximity to and facing said sound reflector to receive reflected sound energy and direct said reflected sound energy in a predetermined pattern, and mounting means for mounting said compressive driver to the assembly so that sound from said compressive driver is directed into said reflector; said sound reflector being shaped to reflect sound substantially in a direction of said compressive driver so that said sound propagates through said sound diffuser.

2. A sound diffuser assembly as in claim 1 in which the reflector is a curved surface of revolution having a center projection adapted to be disposed opposite said compressive driver supported by said assembly.

3. A sound diffuser assembly as in claim 1 in which said diffuser comprises a plurality of spaced shaped curved louvers.

4. A loud speaker system including a compressive driver for emitting sound energy, a sound deflector located in close proximity to said compressive driver and positioned for receiving and redirecting sound energy emitted by said compressive driver in a direction substantially opposite a direction of sound energy from said compressive driver, and a sound diffuser having a plurality of curved spaced concentric rings located adjacent to and facing said sound reflector to receive reflected sound energy and direct the energy in predetermined directions.

* * * * *